United States Patent
Kaczkowski

[11] Patent Number: 5,991,177
[45] Date of Patent: Nov. 23, 1999

[54] CAPACITIVE VOLTAGE TRANSFORMER FOR A METAL-ENCLOSED, GAS-FILLED HIGH-VOLTAGE SYSTEM

[75] Inventor: Andrzej Kaczkowski, Würenlingen, Switzerland

[73] Assignee: Asea Brown Boveri AG, Baden, Switzerland

[21] Appl. No.: 09/042,994

[22] Filed: Mar. 17, 1998

[30]   Foreign Application Priority Data

Apr. 4, 1997 [DE]   Germany ............................ 197 13 916

[51] Int. Cl.$^6$ .............................. H02M 3/06; H01G 5/00; H01G 4/008
[52] U.S. Cl. ............................. 363/62; 361/287; 361/305
[58] Field of Search ................................ 363/60, 61, 62; 307/110; 361/280, 287, 292, 305

[56]   References Cited

U.S. PATENT DOCUMENTS

| | | | |
|---|---|---|---|
| 3,646,412 | 2/1972 | Boersma et al. | 317/244 |
| 4,320,337 | 3/1982 | Hartmann et al. | 323/358 |
| 4,591,783 | 5/1986 | Mastner | 324/126 |
| 4,772,983 | 9/1988 | Kerber et al. | 361/283 |
| 5,272,460 | 12/1993 | Baumgartner et al. | 336/96 |
| 5,432,438 | 7/1995 | Baumgartner et al. | 324/127 |
| 5,444,599 | 8/1995 | Dupraz et al. | 361/303 |

*Primary Examiner*—Peter S. Wong
*Assistant Examiner*—Bao Q. Vu
*Attorney, Agent, or Firm*—Burns, Doane, Swecker & Mathis, L.L.P.

[57]   ABSTRACT

The capacitive voltage transformer is provided for a metal-enclosed, gas-filled high-voltage system. It has a cylindrical capacitor having two coaxially arranged, electrically conducting cylinders (12, 13), of which one internally arranged cylinder (12) is at a high voltage potential and outwardly bounds a current-carrying conductor (5) of the system. An externally arranged one of the two cylinders (13) is inserted in an electrically insulated fashion into the metal enclosure (4). In a first embodiment of the voltage transformer the internal cylinder (12) has an enclosing tube (16) formed from a material having a lower coefficient of linear thermal expansion than copper. In a second embodiment there is provided, for the purpose of correcting the transformed voltage values, a device which detects the value of the current carried in the conductor (5), and in which the change in the capacitance of the cylindrical capacitor is determined as a function of a change in temperature caused by the current carried in the conductor (5). The accuracy of the transformed voltage values is increased by both embodiments.

11 Claims, 3 Drawing Sheets

CAPACITIVE VOLTAGE TRANSFORMER FOR A METAL-ENCLOSED, GAS-FILLED HIGH-VOLTAGE SYSTEM

BACKGROUND OF THE INVENTION

1. Field of the Invention

The invention proceeds from a capacitive voltage transformer for a metal-enclosed, gas-filled high-voltage system according to the preamble of patent claim 1. Such a voltage transformer contains a cylindrical capacitor having two coaxially arranged, electrically conducting cylinders of which an internally arranged cylinder is at a high voltage potential, and an externally arranged cylinder is inserted in an electrically insulated fashion into the metal enclosure. Such a voltage divider can be accommodated in a space-saving fashion in the metal enclosure and can be combined in a simple way with a current transformer.

2. Discussion of Background

In this case, the invention refers to a prior art such as emerges, for example, from EP-A2-522 303. A combined current and voltage transformer, published in this prior art, for a metal-enclosed, gas-filled high-voltage system has a tubularly constructed metal-enclosed section, a conductor guided along the tube axis, and a hollow cylindrical measuring electrode, which is inserted into the metal enclosure in an insulating fashion and concentrically surrounds the conductor, which preferably carries the phase current. The measuring electrode forms with the conductor a cylindrical capacitor which decouples the electric field emanating from the conductor and corresponding to the high voltage supplied, and acts as an overvoltage capacitor of a capacitive voltage divider.

Depending on the measurement task, it is necessary for the voltage values transformed by this apparatus to have a more or less high level of accuracy. The gain influencing the accuracy of the transformed voltage values depends on the temperature of the cylindrical capacitor acting as voltage sensor, as well as on the density of the insulating gas present in the system. The gas density and the temperature of the measuring electrode, acting as external cylinder, of the cylindrical capacitor can be measured with a low outlay, and be taken into account in a simple way when correcting the ratio accuracy. By contrast, there is a problem in measuring the temperature, likewise featuring in the ratio accuracy, of the conductor, which is at a high voltage potential and acting as the internal cylinder of the cylindrical capacitor.

SUMMARY OF THE INVENTION

Accordingly, one object of this invention as specified in patent claim 1 is to provide a novel capacitive voltage transformer of the type mentioned at the beginning for a metal-enclosed, gas-filled high-voltage system which is distinguished by a high ratio accuracy.

The capacitive voltage transformer according to the invention is distinguished in that its ratio accuracy is substantially improved by contrast with a comparable voltage transformer according to the prior art through the use of simple means and without an additional space requirement.

In a first embodiment of the voltage transformer, these advantageous effects are achieved by selecting a suitably constructed internal cylinder of the cylindrical capacitor acting as voltage sensor. The internal cylinder contains an enclosing tube made from a material which has a substantially lower coefficient of linear thermal expansion by comparison with the customary material for conductors, such as, for example, copper or aluminum. The enclosing tube can surround the conductor concentrically, and is at the same potential as the conductor. Alternatively, the enclosing tube can also form the conductor. In each case, the enclosing tube, which is heated by the operating current of the system and acts as the internal cylinder of the cylindrical capacitor, does not change the capacitance of the cylindrical capacitor which features in the gain as strongly as a conductor which usually consists of copper or aluminum and acts as the internal cylinder of the high-voltage capacitor. Consequently, even in the case of operating currents of different magnitude, the transformed voltage values deviate substantially less from one another than in the case of the voltage transformer according to the prior art.

In a second embodiment, the aforementioned advantageous effects are achieved by a device which detects the value of the current carried in the conductor. This device periodically corrects the transformed voltage values. The correcting device determines a correction factor required for this purpose by determining the change in the capacitance of the cylindrical capacitor as a function of a change in temperature caused by the current carried in the conductor. By contrast with the first embodiment, this requires a current transformer and a computer which determines the correction factor for the transformed voltage values with the aid of a computer program from system-specific parameters determined in preliminary tests and from the transformed current values. This embodiment of the voltage transformer according to the invention is particularly advantageous when the voltage transformer is combined with a current transformer, since then there is only a further need for a computer which is normally already present in any case.

If the correcting device previously described is built into the capacitive voltage transformer according to the invention, which contains the enclosing tube made from a material having a low coefficient of linear thermal expansion, the gain of said voltage transformer can additionally be substantially improved.

BRIEF DESCRIPTION OF THE DRAWINGS

A more complete appreciations of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
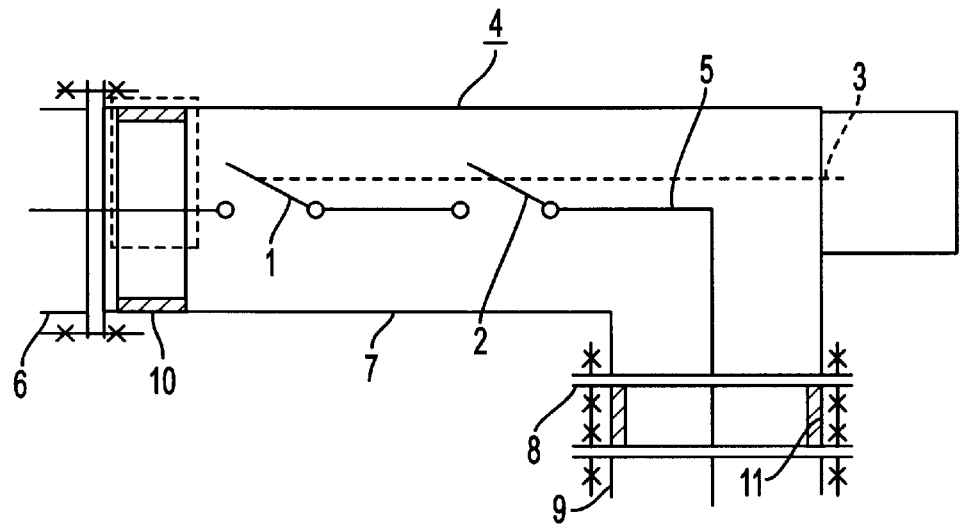
FIG. 1 shows a top view of a centrally conducted section through a part of a metal-enclosed, gas-filled high-voltage system having sensors of capacitive voltage transformers according to the invention.

Referring now to the drawings, wherein like reference numerals designate identical or corresponding parts throughout the several views, a part of a metal-enclosed, gas-filled high-voltage system which contains a circuit-breaker having switching points 1, 2 and a drive 3 is represented in FIG. 1. In this case, the tubular metal enclosure, which is at ground potential and denoted by the reference symbol 4, is filled with an insulating gas, such as $SF_6$ in particular, at a pressure of a few bars. Arranged in the interior of the metal enclosure 4 is a conductor 5 extending along the axis of its tube. This conductor is supported on insulators (not represented) which are flanged between the enclosure sections 6, 7 or 7, 8 or 8, 9 and preferably partition off an insulating gas. Sensors 10, 11 are provided in the interior of the metal enclosure 4. These sensors surround the conductor 5 concentrically and have the same axis as the parts of the metal enclosure 4 which hold them, that is to say a part of the enclosure section 7 or the enclosure section 8. If the metal enclosure 4 has more than one conductor, then although the sensors do surround the assigned conductor concentrically, they then do not have the same axis as the metal enclosure.

Figure 2:
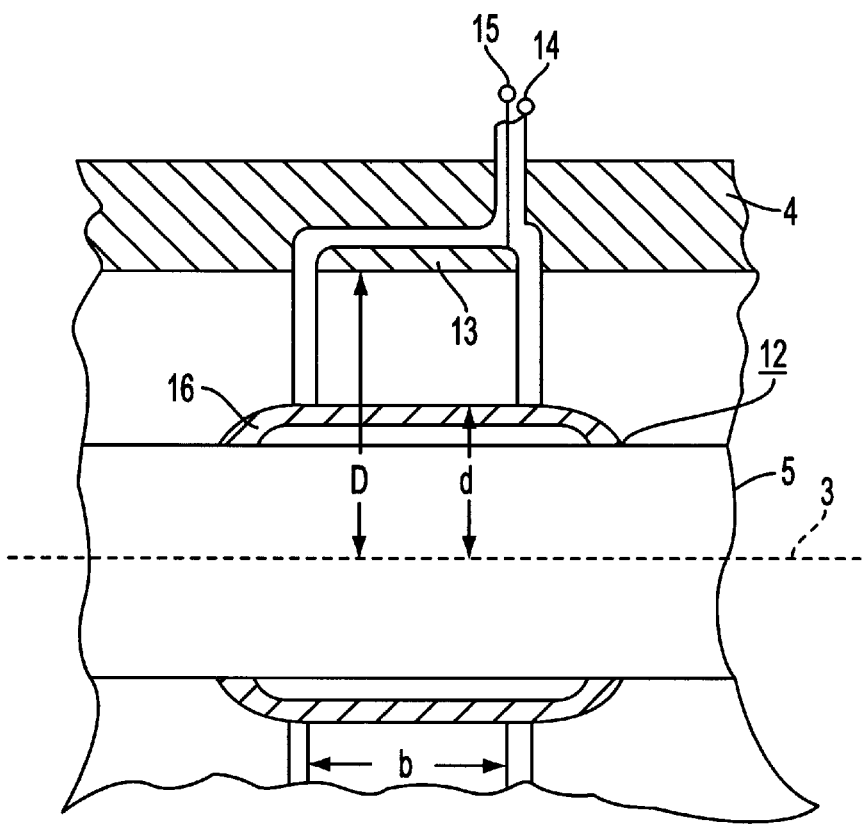
FIG. 2 shows an enlargement of a part, marked in FIG. 1 by a dashed frame, of a first embodiment of the capacitive voltage transformer according to the invention.
Figure 3:
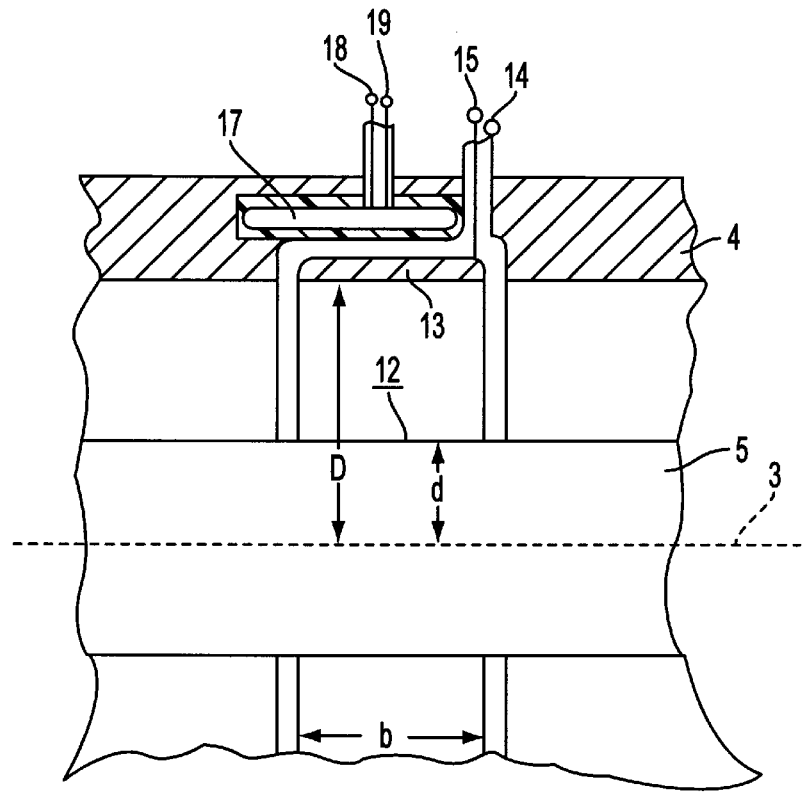
FIG. 3 shows an enlargement of a part, marked in FIG. 1 by a dashed frame, of a second embodiment of the capacitive voltage transformer according to the invention.
Figure 4:
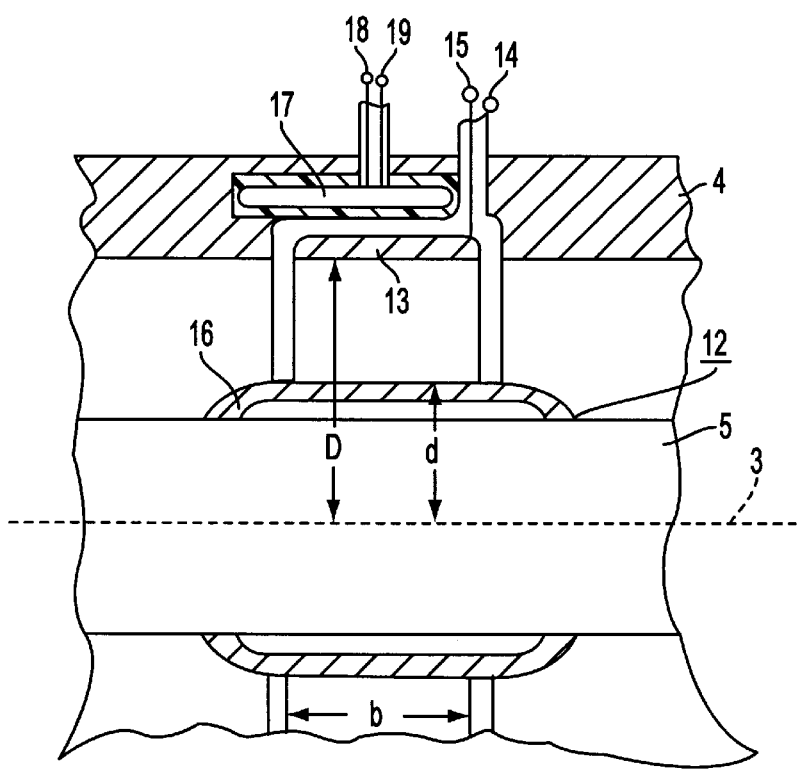
FIG. 4 shows an enlargement of a part, marked in FIG. 1 by a dashed frame, of a third embodiment of the capacitive voltage transformer according to the invention.

The region of three different embodiments of the sensor 10 which is marked with a dashed frame in FIG. 1 is represented enlarged in FIGS. 2 to 4. In all three embodiments, the sensor 10 is part of the voltage divider of a capacitive voltage transformer. The voltage transformer has a cylindrical capacitor, which serves as a voltage sensor and has two coaxially arranged cylinders made from an electrically conducting material. An internally arranged cylinder 12 is at a high voltage potential, while an externally arranged cylinder 13 is inserted in an electrically insulated fashion into an annular groove recessed into the inner surface of the metal enclosure 4. The external cylinder 13 consists of aluminum or copper, and has an inside diameter D and an axial length b. The external cylinder 13 is connected to the inner conductor 15 of a shielded cable, which has a shield 14 and is guided in a gas-tight fashion through the metal enclosure 4 to a signal processing device (not represented in FIGS. 2 to 4) of the voltage transformer. In the embodiments in accordance with FIGS. 2 and 4, the internal cylinder 12 comprises the conductor 5 and an enclosing tube 16 which concentrically surrounds the conductor and is at the same potential as the conductor 5, and which projects in the axial direction beyond the two ends of the external cylinder 13. The material of the enclosing tube 16 has a smaller coefficient of linear thermal expansion than the copper or aluminum normally used as material for the conductor, and should, in addition, be non-ferromagnetic, with the result that, for example, Invar steel is ruled out. The coefficient of linear thermal expansion of the material of the enclosing tube is advantageously lower than $10 \cdot 10^{-6} K^{-1}$. A copper alloy containing molybdenum and/or tungsten principally comes into consideration as a suitable material for the enclosing tube. In the embodiment in accordance with FIG. 3, the enclosing tube is integrated into the conductor 5, and is constructed in such a way that it can carry the operating current.

In the embodiments in accordance with FIGS. 3 and 4, a current sensor of an inductive current transformer which is preferably constructed as a Rogowski coil 17 is located in each case in the enclosure 4. The signal terminals 18 and 19 of the Rogowski coil are routed in a shielded cable in a gas-tight fashion outward through the enclosure 4 to the signal processing device (not represented in FIGS. 3 and 4).

The mode of operation of the voltage transformer in accordance with FIGS. 2 to 4 is as follows: the gain of the voltage transformer is a linear function of the capacitance of the cylindrical capacitor. The capacitance C of this capacitor is determined with adequate accuracy by the following formula:

$$C = \epsilon_0 \cdot \epsilon_r \cdot 2 \cdot \pi \cdot b / ln(D/d) \text{ in which}$$

$\epsilon_r$ denotes the dielectric constant of the insulating gas.

When operating current is being carried, a temperature difference $\Delta\theta$ is set up between the internal cylinder 12 and the external cylinder 13. This temperature difference effects different changes in the outside diameter d of the internal cylinder 12 and in the inside diameter D of the external cylinder 13. Consequently, there is also a change in the capacitance C of the cylindrical capacitor. If the internal cylinder 12 and external cylinder 13 or conductor 5 and enclosure 4 consist of the same material, for example of aluminum, and if this material has the coefficient of linear thermal expansion $\alpha$, the relative change $\Delta C/C$ of the capacitance is determined as follows:

$$\Delta C/C = \alpha \cdot \Delta\theta / ln(D/d).$$

If the internal cylinder 12 or the enclosing tube 16 and the external cylinder 13 or the enclosure 5 holding the external cylinder consist of different materials, for example the enclosing tube consists of a copper alloy containing approximately 15 to 25 percent by weight of tungsten and having a coefficient of linear thermal expansion $\alpha_I = 10 \cdot 10^{-6} K^{-1}$, and the enclosure consists of aluminum having a coefficient of linear thermal expansion $\alpha_A = 24 \cdot 10^{-6} K^{-1}$, the change in capacitance $\Delta C/C$ is calculated as follows:

$$\Delta C/C = (\Delta\theta_I \cdot \alpha_I - \Delta\theta_A \cdot \alpha_A) / ln(D/d),$$

$\Delta\theta_I$ or $\Delta\theta_A$ denoting the heating of the internal cylinder 12 or of the external cylinder 13 with respect to a prescribed calibration temperature.

The following table represents the effects of this for different geometrical dimensions of the cylinders 12, 13 or for a different geometrical configuration of the system.

| D/d | 2 | 2.7 | 3.5 |
|---|---|---|---|
| ΔC/C (Material only Al) in % | 0.121 | 0.085 | 0.067 |
| ΔC/C (Material Cu80W20 inside, Al outside) in % | 0.01–0.05 | 0.007–0.035 | 0.006–0.028 |

Regions determined by temperature of the enclosure

It is to be seen from this table that with an enclosing tube having a coefficient of linear thermal expansion of approximately $10 \cdot 10^{-6} K^{-1}$ as compared with a conductor 5 made from aluminum, a change in capacitance occurs which is up to 12 times smaller, depending on the enclosure temperature. The transformed voltage values correspondingly have an accuracy which is higher by up to 0.1%.

In the embodiments in accordance with FIGS. 3 and 4, the Rogowski coil can be used simultaneously to detect the current I flowing in the conductor 5 and responsible for the heating. This current causes the different heating of the internal cylinder and external cylinder of the cylindrical capacitor, and causes the undesired change in the capacitance of the cylindrical capacitor. By detecting this current, the change in the capacitance can be calculated and a correction factor can be prepared from this in order to improve the transformed voltage values. This holds both for the transformed voltage values in the case of a capacitive voltage transformer in which the conductor 5 consists of a conventional material such as aluminum or copper, for example, and forms the internal cylinder of the cylindrical capacitor (FIG. 3), or for a capacitive voltage transformer having an enclosing tube 16 which surrounds the conductor 5 and is made from a material having a lower coefficient of linear thermal expansion than aluminum or copper (FIG. 4).

Figure 5:
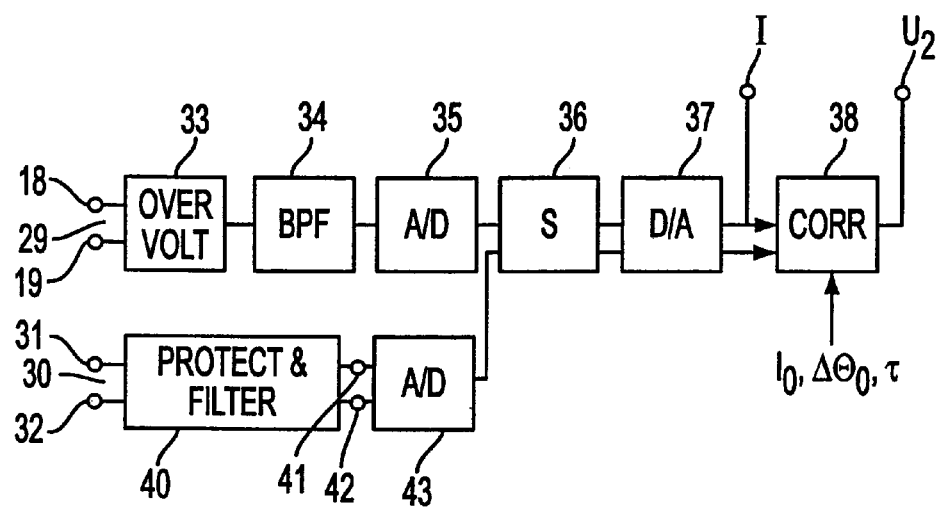
FIG. 5 shows a block diagram of a signal processing device of the capacitive voltage transformer in accordance with FIG. 3.
Figure 6:
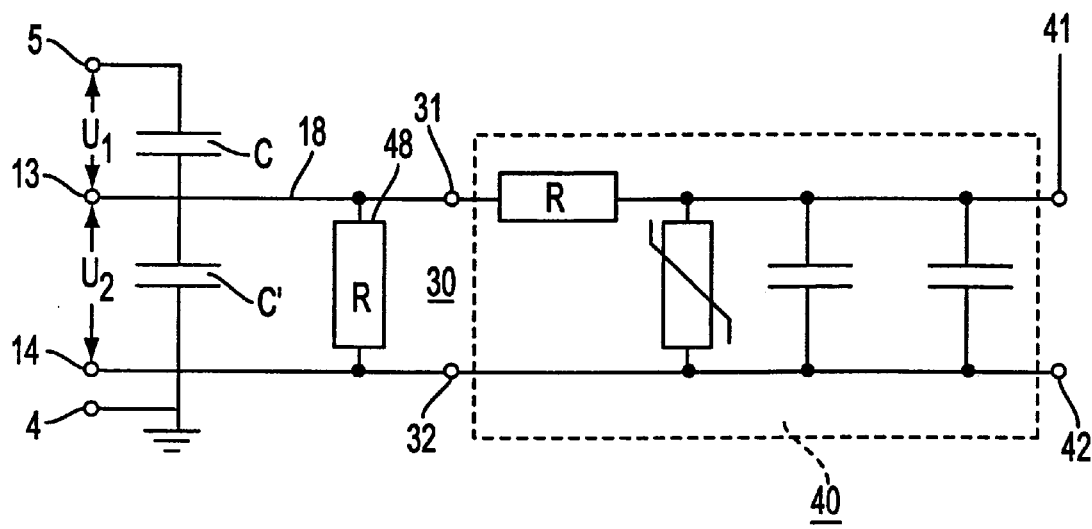
FIG. 6 shows a circuit diagram, presented in part as an equivalent circuit diagram, of the embodiments of the voltage transformer in accordance with FIGS. 2 to 4.

The signal processing device represented as a block diagram in FIG. 5 can be used to carry out this task of correction. This device has two inputs 29, 30. Signals corresponding to the time change in the current I are fed via the signal lines 18, 19 to the input 29 from the Rogowski coil 17 acting as current sensor. Voltage signals $dU_2(t)/dt$ corresponding to the time change in the high voltage U, present on the conductor 5 are fed to the input 30 via signal lines 31 and 32 from the capacitive voltage divider, containing the cylindrical capacitor, of the voltage transformer. It is to be seen from FIG. 6 that these signals are formed by a voltage divider formed by the cylindrical capacitor that has capacitance C and an auxiliary capacitor with the capacitance C', and an ohmic resistor 48 connected between the external cylinder 13 of the cylindrical capacitor and the shield 14.

The Rogowski coil 17 acting as current sensor supplies signals proportional to the time change in the current flowing in the conductor 5. Via an overvoltage protector 33 and a bandpass filter 34, which typically has a passband between 0.05 Hz and 5 kHz when the system is operated with AC voltages of 50 Hz, these signals act on the input of an analog-to-digital converter 35 which is tuned to the bandpass filter 34 with respect to its dynamic operating range. The signals digitized in the analog-to-digital converter 35 are subsequently integrated in an integrating device 36, preferably constructed as a digital IIR filter, to form a signal corresponding to the current I to be determined. This signal is then relayed for further processing via a downstream digital-to-analog converter 37 to a correcting device 38 designed as a computer.

Signals $dU_2(t)/dt$ proportional to the time change in the high voltage present on the conductor 5 are fed to the input 30. These signals act via a protective and filtering element 40 and signal lines 41, 42 on an analog-to-digital converter 43 constructed in a fashion corresponding to the analog-to-digital converter 35. The signals digitized in the analog-to-digital converter 43 are subsequently conditioned in the integrating device 36, operating in a multiplex fashion, and fed to the correcting device 38 via the digital-to-analog converter 37.

Parameters determined from preliminary tests, such as, in particular, a mean operating current $I_o$ preferably corresponding to the nominal current, a temperature difference $\Delta_{\theta 0}$ set up between the conductor and the metal enclosure in the case of the mean operating current, and the thermal time constant $\tau$ of the system, which is typically at 1000 to 2000 s, as well as a computer program, are stored in the correcting device 38. This computer program periodically determines the temperature difference $\Delta\theta_{act}$, assigned to a measuring period $\Delta t (300 \text{ s} \geq \Delta t \geq 100 \text{ ms})$, between the internal cylinder and external cylinder of the cylindrical capacitor, from the stored parameters and the periodically measured operating current I. A factor K for correcting the voltage value transformed in the measuring period $\Delta t$ is determined from the determined temperature difference $\Delta\theta_{act}$, the outside diameter d of the internal cylinder 12, the inside diameter D of the external cylinder 13 and the coefficient of linear thermal expansion $\alpha_I$ of the internal cylinder and $\alpha_A$ of the enclosure. In the case of an identical coefficient of linear thermal expansion $\alpha_M$ for the enclosing tube 16 and enclosure 4 or outside electrode 13, the correction factor K is fixed as follows:

$$K = 1 - \Delta\theta_{act} \cdot \alpha_M / \ln(D/d).$$

The value of $\Delta\theta_{act}$ featuring in the correction factor can be determined as follows:
(a) the operating current I is measured in $n(n=1, 2, \ldots, i, i+1, \ldots, n)$ measuring periods $\Delta t$,
(b) a fictitious temperature difference $\Delta\theta_{target}$ is calculated from the magnitude of the operating current I determined in the ith measuring period, using the relationship $\Delta\theta_{target}[i \cdot \Delta t] = \Delta\theta_0 \cdot (I/Io)^2$, and
(c) the value of $\Delta\theta_{act}$ in the (i+1)th measuring period is calculated, using a recursion formula specified below, from the values of $\Delta\theta_{act}$ and $\Delta\theta_{target}$ previously determined in the ith measuring period, as follows:

$$\Delta\theta_{act}[(i+1) \cdot \Delta t] = \Delta\theta_{act}[i \cdot \Delta t](1 - \Delta t/\tau) + \Delta\theta_{target}[i \cdot \Delta t]\Delta t/\tau,$$

Voltage values $U_2$ corrected using the factor K have an accuracy of more than 0.018% or 0.013% or 0.010% in the case of a temperature difference of $\Delta\theta = 35°$ K. and a ratio D/d of 2 or 2.7 or 3.5.

In the case of a coefficient of linear thermal expansion $\alpha_I$ for the material of the internal cylinder and $\alpha_A$ for the material of the external cylinder, a correction factor is calculated as follows:

$$K = 1 - (\Delta\theta_I \cdot \alpha_I - \Delta\theta_A \cdot \alpha_A)/\ln(D/d),$$

it being the case that $\Delta\theta_I$ and $\Delta\theta_A$ are the heating of the internal cylinder or of the external cylinder with respect to a prescribed calibration temperature.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A capacitive voltage transformer for a metal-enclosed, gas-filled high-voltage system, comprising:
   a cylindrical capacitor which has two coaxially arranged, electrically conducting cylinders, of which an internal cylinder is at a high voltage potential and outwardly bounds a current-carrying conductor of the system, and an external cylinder is located, in an electrically insulated fashion, in a metal enclosure, said transformer having at least one of:
   an enclosing tube of said internal cylinder formed from a material which has a lower coefficient of linear thermal expansion than copper; and
   a correcting device for correcting transformed voltage values, by detecting a value of current carried in the conductor, a change in capacitance of the cylindrical capacitor being determined as a function of a change in temperature caused by the current carried in the conductor.

2. The voltage transformer as claimed in claim 1, wherein the enclosing tube concentrically surrounds the conductor and is at the same potential as the conductor.

3. The voltage transformer as claimed in claim 1, wherein the enclosing tube forms the conductor.

4. The voltage transformer as claimed in claim 2, wherein the coefficient of linear thermal expansion of the material of the enclosing tube is lower than $10 \cdot 10^{-6} K^{-1}$.

5. The voltage transformer as claimed in claim 4, wherein the material of the enclosing tube is formed from a copper alloy containing at least one of molybdenum and tungsten.

6. The voltage transformer as claimed in claim 1, wherein parameters determined from preliminary tests include a mean operating current $I_o$, a temperature difference $\Delta\theta_0$ set up between the conductor and the metal enclosure for the mean operating current $I_o$, and a thermal time constant $\tau$ of the system, and are stored in the correcting device with a computer program which determines from the stored parameters and an operating current I periodically measured in the conductor, a temperature difference $\Delta\theta_{act}$ assigned to a measuring period $\Delta t$ between the internal cylinder and external cylinder of the cylindrical capacitor, and determines from the temperature difference $\Delta\theta_{act}$ an outside diameter d of the internal cylinder, an inside diameter D of the external cylinder, a coefficient of linear thermal expansion $\alpha_I$ of the internal cylinder and a coefficient of linear expansion $\alpha_A$ of the enclosure, a correction factor K for correcting a voltage value transformed in the measuring period $\Delta t$.

7. The voltage transformer as claimed in claim 6, wherein for a coefficient of linear thermal expansion $\alpha_M$ identical for the enclosing tube and enclosure, the correction factor K is calculated as follows:

$$K = 1 - \Delta\theta_{act}\alpha_M \ln(D/d).$$

8. The voltage transformer as claimed in claim 6, wherein $\Delta\theta_{act}$ is determined as follows:
(a) the operating current I is measured in n measuring periods $\Delta t$ where n=1, 2 ... i, 1+1, ... n,
(b) a fictitious temperature difference $\Delta\theta_{target}$ is calculated from the magnitude of the operating current I determined in the ith measuring period, using a relationship:

$$\Delta\theta_{target}\{i\cdot\Delta t\} = \Delta\theta_o \cdot (I/I_o)^2, \text{ and}$$

(c) the value of $\Delta\theta_{act}$ in the (i+1)th measuring period is calculated, using a recursion formula, from values of $\Delta\theta_{act}$ and $\Delta\theta_{target}$ previously determined in the ith measuring period, as follows:

$$\Delta\theta_{act}\{(i+1)\cdot\Delta t\} = \Delta\theta_{act}\{i\cdot\Delta t\}(1-\Delta t/\tau) + \Delta\theta_{target}\{i\cdot\Delta t\}\cdot\Delta t/\tau$$

with $i=1, 2, \ldots, n$ and $$\theta\Delta_{act}\{n\cdot\Delta t\} = \Delta\theta_{act}.$$

9. The voltage transformer as claimed in claim 6, wherein the duration of a measuring period $\Delta t$ is between 100 ms and 300 s.

10. The voltage transformer as claimed in claim 6, wherein for a coefficient of linear thermal expansion $\alpha_I$ for the material of the internal cylinder and $\alpha_A$ for the material of the external cylinder, a correction factor is calculated as follows:

$$K = 1 - (\Delta\theta_I\alpha_I - \Delta\theta_A\alpha_A)/\ln(D/d),$$

$\Delta\theta_I$ and $\Delta\theta_A$ are heating of the internal cylinder and of the external cylinder with respect to a prescribed calibration temperature.

11. The voltage transformer as claimed in claim 1, wherein the conductor is part of a current transformer which acts on an input of the correcting device.

* * * * *